(12) United States Patent
Ribeyron et al.

(10) Patent No.: US 7,943,417 B2
(45) Date of Patent: May 17, 2011

(54) METHOD FOR METALLIZATION OF PHOTOVOLTAIC CELLS WITH MULTIPLE ANNEALING OPERATIONS

(75) Inventors: Pierre Jean Ribeyron, Saint Ismier (FR); Sébastien Dubois, Grenoble (FR); Nicolas Enjalbert, Les Avenirs (FR)

(73) Assignee: Commissariat a l'Energie Atomique, Paris (FR)

( * ) Notice: Subject to any disclaimer, the term of this patent is extended or adjusted under 35 U.S.C. 154(b) by 155 days.

(21) Appl. No.: 11/845,871

(22) Filed: Aug. 28, 2007

(65) Prior Publication Data
US 2008/0076203 A1    Mar. 27, 2008

(30) Foreign Application Priority Data

Sep. 21, 2006   (FR) ...................... 06 53884

(51) Int. Cl.
*H01L 21/00* (2006.01)
*H01L 21/02* (2006.01)
*H01L 27/14* (2006.01)
*H01L 31/0232* (2006.01)

(52) U.S. Cl. ............ 438/98; 438/72; 257/431; 257/432; 257/437

(58) Field of Classification Search .............. 438/72, 438/98; 257/431, 432, 437, E31.093
See application file for complete search history.

(56) References Cited

U.S. PATENT DOCUMENTS

| | | | |
|---|---|---|---|
| 4,577,393 A | 3/1986 | Schmidt | |
| 4,680,085 A * | 7/1987 | Vijan et al. | 438/482 |
| 5,688,366 A * | 11/1997 | Ichinose et al. | 438/754 |
| 5,935,345 A * | 8/1999 | Kuznicki | 136/255 |
| 2005/0189015 A1 | 9/2005 | Rohatgi et al. | |

OTHER PUBLICATIONS

Nijs J. F.; "Advanced Manufacturing Concepts for Crystalline Silicon Solar Cells" IEEE Transactions on Electron Devices, IEEE Service Center, Pisacataway, NJ; vol. 46, No. 10, Oct. 1999; pp. 1948-1969.
Sana P. et al; "The effect of aluminum treatment and forming gas anneal on EFG silicon solar cells"; Proceedings of the Photovoltaic Specialists Conference; Louisville, May 10-14, 1993, New York, IEEE; vol. conf. 23, May 10, 1993; pp. 111-116.
Okamoto S. et al. "23.5 % efficient silicon solar cell with rear micro contacts of c-Si spl mu/c-Si:H heterostructure"; Conference Record of the 26th IEEE Photovoltiac Specialists Conference, Sep. 29, 1997, pp. 255-258.

(Continued)

*Primary Examiner* — Michael S Lebentritt
*Assistant Examiner* — Karen M Kusumakar
(74) *Attorney, Agent, or Firm* — Pearne & Gordon LLP

(57) ABSTRACT

Method for metallization of at least one photovoltaic cell comprising a substrate based on a semiconductor with a first type of conductivity, a layer doped with a second type of conductivity produced in the substrate and forming a front face of the substrate, an antireflection layer produced on the front face of the substrate and forming a front face of the photovoltaic cell. The method comprises at least the steps of:
  a) producing at least one metallization on the front face of the photovoltaic cell,
  b) a first annealing of the photovoltaic cell at a temperature between around 800° C. and 900° C.,
  c) producing at least one metallization on the rear face of the substrate,
  d) a second annealing of the photovoltaic cell at a temperature between around 700° C. and 800° C.

16 Claims, 4 Drawing Sheets

OTHER PUBLICATIONS

French Search Report Dated May 15, 2007.

Suresh Kumar Dhungel, et al.; "Effect of pressure on surface passivation of silicon solar cell by forming gas annealing"; Materials Science in Semiconductor Processing, vol. 7, Oct. 22, 2004, pp. 427 to 431.

S. Martinuzzi et al; "N-Type Multicrystalline Silicon for Solar Cells"; 20th EPSEC, 2005, Barcelona, pp. 631 to 634.

Dong Seop Kim et al; Ribbon Si solar cells with efficiencies over 18 % by hydrogenation of defects;Solar Energy Materials & Solar Cells, vol. 90, pp. 1227 to 1240, 2006.

Santo Martinuzzi et al; "Hydrogen passivation of defects in multicrystalline silicon solar cells"; Solar Energy Materials & Solar Cells, vol. 80, pp. 343 to 353, 2003.

Evaluation of Conversion Efficiency Gain Provided by the Metallization Method According to Claim 1; Ribeyron, et al., May 28, 2010.

Influence of Substitutional Metallic Impurities on the Performances of p-type Crystalline Silicon Solar Cells: The Case of Gold; Journal of Applied Physics, Dubois, et al.; Dec. 18, 2006.

Hydrogenation of Si from SinX (H) films: Characterization of H introduced into the Si; Applied Physics Letters; Fan Jiang et al., Aug. 4, 2003.

* cited by examiner

METHOD FOR METALLIZATION OF PHOTOVOLTAIC CELLS WITH MULTIPLE ANNEALING OPERATIONS

TECHNICAL FIELD AND PRIOR ART

This invention relates to the field of photovoltaic cells and more specifically a method for metallization of photovoltaic cells.

A standard method used for the industrial production of a photovoltaic cell 20 based on P- or N-type crystalline (monocrystalline or multicrystalline) silicon is shown in FIGS. 1A to 1E. An N- or a P-type substrate 2 first undergoes a texturisation of its surfaces by use of a potassium hydroxide solution, making it possible to reduce the reflectivity of these surfaces and thus obtain a better optical confinement of the beams entering the substrate 2. An N+ type layer 4 is formed in the substrate 2 by diffusion of phosphorus at the level of all of the faces of the substrate 2 (FIG. 1A). An antireflection layer 6 of hydrogen-rich silicon nitride (SiN—H) is then deposited on the N+ layer 4 by plasma-enhanced chemical vapour deposition (PECVD), as shown in FIG. 1B, forming a front face 8 of the photovoltaic cell 20. Silver 10 and aluminium 12 metallizations are formed by serigraphy respectively on the front face 8 and on the rear face of the substrate 2 (FIG. 1C). Finally, these metallizations 10, 12 undergo an annealing operation in an infrared passage furnace, forming contacts 14 between the front metallizations 10 and the N+ layer 4, as well as a layer 16 based on aluminium and silicon alloy, and a P+ type layer 18 in the substrate 2, replacing a portion of the N+ layer 4 under the rear metallization 12.

Finally, as shown in FIG. 1E, the portions of the N+ layer 4 connecting the layer 18 to the contacts 14, i.e. electrically connecting the metallizations 10 of the front face to the metallization layer 12 of the rear face, are removed. In FIG. 1E, all of the elements of the photovoltaic cell 20 located on the external side of planes AA and BB are removed, for example by laser, plasma, coating or any other etching means.

In the case of a P-type substrate 2, the remaining portion of the N+ layer 4 and the substrate 2 form the PN junction of the photovoltaic cell 20. The P+ layer 18 enables the passivation of the rear face of the substrate 2 by a back-surface field effect (BSF) pushing minority carriers, in this case electrons, into the substrate 2. In the case of an N-type substrate 2, it is the P+ layer 18 and the substrate 2 that form the PN Junction of the photovoltaic cell 20, and the N+ layer 4 performs the passivation of the front face of the substrate 2 by a front-surface field effect (FSF) pushing the minority carriers, in this case holes, into the substrate 2, with the antireflection layer 6 also contributing to this passivation. The document "N-type multicrystalline silicon for solar cells" of S. Martinuzzi et al, 20th EPSEC, 2005, Barcelona, pages 631 to 634, describes such a photovoltaic cell, with the annealing temperature described being between 850° C. and 900° C.

In the annealing operation, hydrogen migrates in the form of ions from the hydrogen-rich antireflection layer 6 over several micrometers before forming molecular hydrogen $H_2$ of which the diffusion is limited in the silicon of the substrate 2, and which does not have the property, as the hydrogen ions do, of passivating the crystallographic defects and the impurities. However, in the formation of the alloy layer 16, gaps migrate in the substrate 2 and enable the dissociation of the $H_2$ molecules, allowing the hydrogen ions to diffuse much more deeply in the substrate 2, enhancing the lifetime of the carriers in the substrate 2 and therefore also improving the conversion efficiency of the photovoltaic cell 20. In addition, this alloy layer 16 makes it possible to enhance the quality of the silicon of the substrate 2 by the getter effect, trapping the impurities by a segregation mechanism. This hydrogenation phenomenon in the annealing operation is described in the document "Hydrogen passivation of defects in multicrystalline silicon solar cells" of S. Martinuzzi et al, Solar Energy Materials & Solar Cells, vol. 80, pages 343 to 353, 2003.

The diffusion of hydrogen in the substrate 2 is particularly effective when the densities of extended crystallographic defects, such as dislocations or twin boundaries, are high. The passivation by hydrogen is very useful when the concentrations of impurities, primarily metallic, are high, for example in the materials developed from low-quality fillers (metallurgical silicon fillers), or dislocation-rich materials, such as those from electromagnetic continuous casting or tape drawing.

The document "Ribbon Si solar cells with efficiencies over 18% by hydrogenation of defects", of D. S. Kim et al., Solar Energy Materials & Solar Cells, vol. 90, pages 1227 to 1240, 2006, describes an annealing of the rear face of a photovoltaic cell at a temperature between 700° C. and 800° C. in an RTP (rapid thermal processing) furnace. In the example described, the metallizations on the front face are performed by photolithography and etching of an antireflection layer, and evaporation of titanium, palladium and silver. The cell obtained offers an efficiency slightly above 18% with a P-type multicrystalline silicon substrate obtained by tape drawing, but the method proposed is not economically viable and is difficult to apply industrially.

DESCRIPTION OF THE INVENTION

Thus there is a need to propose a method for metallization of photovoltaic cells making it possible to obtain photovoltaic cells that are more efficient than the cells produced according to the methods of the prior art described above, and that are economically viable in the industry.

An embodiment of the present invention proposes a method for metallization of at least one photovoltaic cell comprising a substrate based on a semiconductor with a first type of conductivity, a layer doped with a second type of conductivity produced in the substrate and forming a front face of the substrate, an antireflection layer produced on the front face of the substrate and forming a front face of the photovoltaic cell, which method comprises at least the steps of:

a) producing at least one metallization on the front face of the photovoltaic cell, b) a first annealing of the photovoltaic cell at a temperature between around 800° C. and 900° C., c) producing at least one metallization on the rear face of the substrate, d) a second annealing of the photovoltaic cell at a temperature between around 700° C. and 800° C.

We thus obtain a better passivation of the impurities and crystallographic defects in the substrate of the photovoltaic cell during the production of metallizations of the photovoltaic cell according to an embodiment of this invention than with the metallization methods of the prior art. This method is therefore particularly suitable for producing photovoltaic cells comprising substrates obtained from fillers of lower quality and dislocation-rich materials, for example the silicon from electromagnetic continuous casting or tape drawing.

The method can be applied both to N-type and to P-type substrates.

Another embodiment relates to a method for producing at least one photovoltaic cell, comprising at least the steps of:

texturising the surfaces of a substrate based on a semiconductor with a first type of conductivity, forming a layer doped with a second type of conductivity in the substrate forming a front face of the substrate, depositing an antireflection layer on the front face of the substrate, which layer forms a front face of the photovoltaic cell, implementing a method for metallization as described above, which is also an object of this invention, removing at least a portion of the layer doped with the second type of conductivity electrically connecting or coupling the metallization of the front face to the metallization of the rear face of the photovoltaic cell.

BRIEF DESCRIPTION OF THE DRAWINGS

This invention can be better understood on reading the following description of example embodiments provided purely as a non-limiting indication, in reference to the appended drawings, in which.

Identical, similar or equivalent parts of the different figures described below have the same numeric references for the sake of consistency between the figures.

The different parts shown in the figures are not necessarily shown according to a uniform scale, so as to make the figures easier to read.

The various possibilities (alternatives and embodiments) must be understood as not being mutually exclusive and can be combined with one another.

DETAILED DESCRIPTION OF SPECIFIC EMBODIMENTS

We will refer to FIGS. 2A to 2E, which show the steps of a method for producing a photovoltaic cell 100. A method for metallization of the photovoltaic cell 100 will also be described in association with these figures.

Figure 1A:
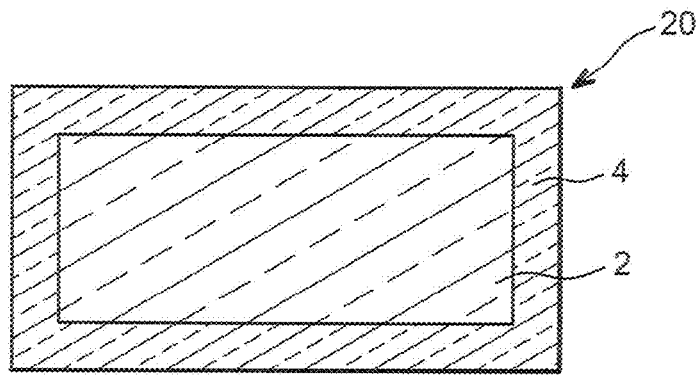
FIGS. 1A to 1E described above show the steps of a method for producing a photovoltaic cell according to the prior art.
Figure 1B:
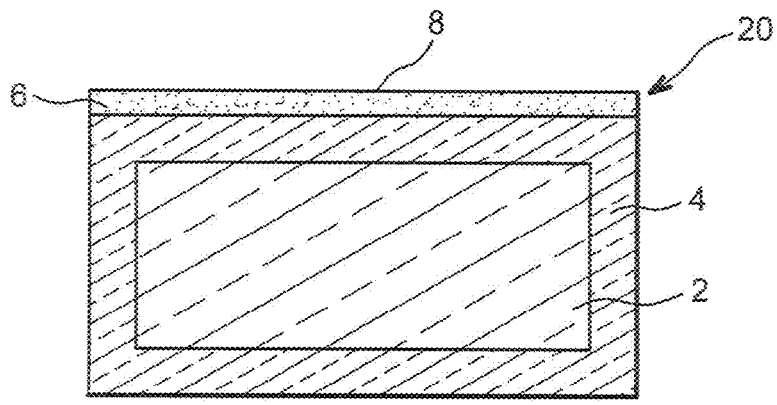
Figure 1C:
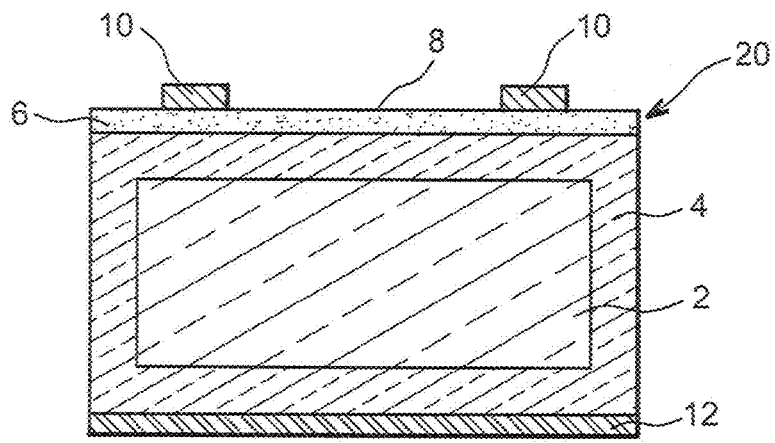
Figure 1D:
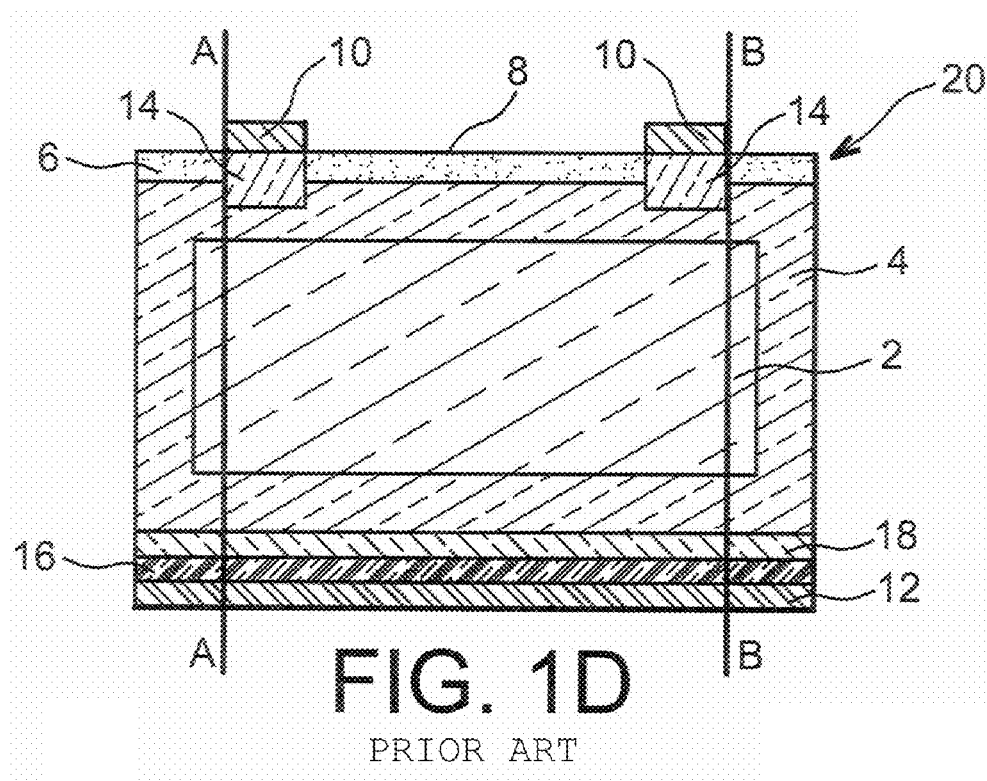
Figure 1E:
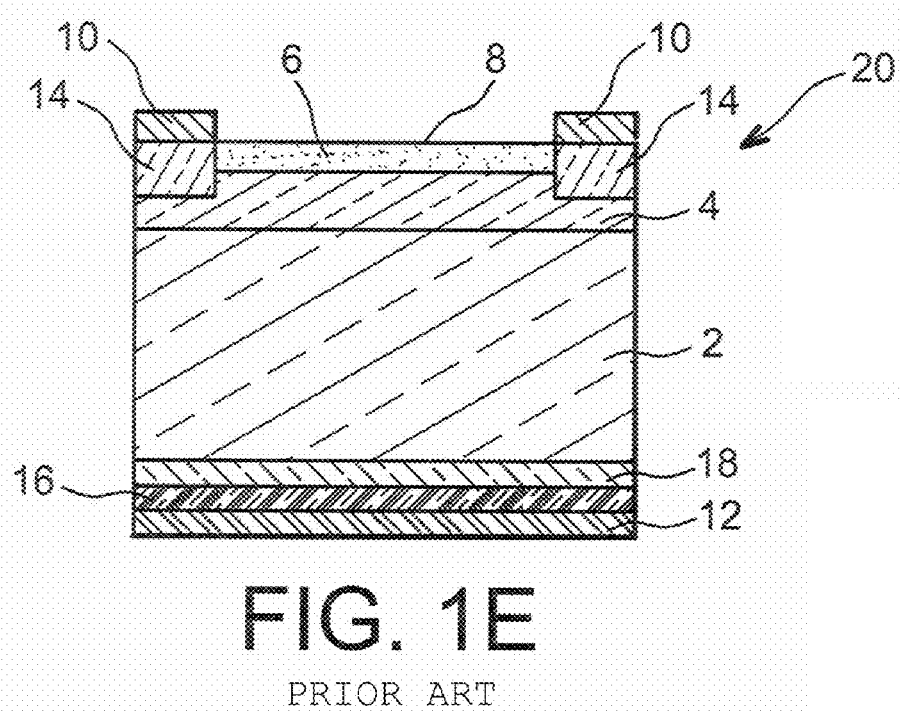
Figure 2A:
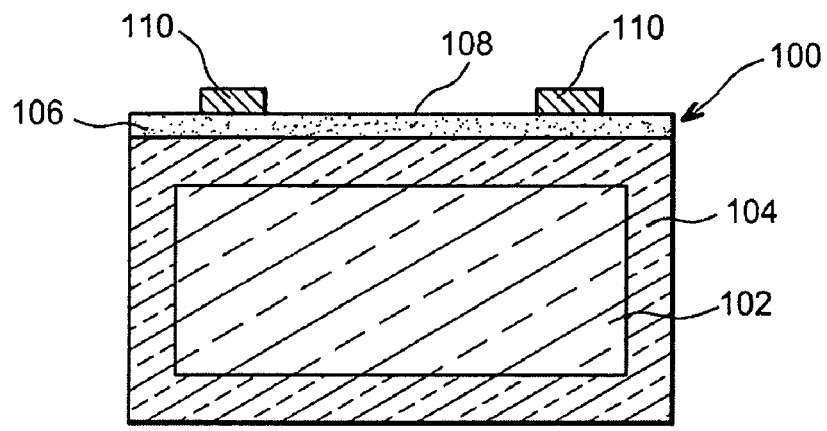
FIGS. 2A to 2E show the steps of a method for producing a photovoltaic cell, according to an embodiment of the invention, comprising metallizations produced according to a method also according to an embodiment of the invention.

A substrate 102 with a first type of conductivity, for example based on P-type multicrystalline or monocrystalline silicon, is shown in FIG. 2A. To produce the photovoltaic cell 100, the surfaces of the substrate 102 are first texturised using a potassium hydroxide solution. A layer 104 doped with a second type of conductivity, for example of the N+ type, is then formed by diffusion of phosphorus in the substrate 102. This layer 104 in particular forms a front face of the substrate 102 on which, for example by PECVD, an antireflection layer 106 is deposited, which layer is for example rich in hydrogen and based on silicon nitride or silicon carbide, and forms a front face 108 of the photovoltaic cell 100. The PN junction of the photovoltaic cell 100 is formed by the P-type substrate 102 and the N+ layer 104.

A step of hydrogenation of the substrate 102, for example by plasma, can be implemented during the process. This step can be performed for example before and/or after the deposition of the antireflection layer 106.

The method for metallization of the photovoltaic cell 100 will now be described. As shown in FIG. 2A, metallizations 110, for example based on silver, are produced for example by serigraphy on the front face 108 of the photovoltaic cell 100.

The metallizations 110 can also be based on at least one metal other than silver, and formed by other techniques such as photolithography or printing.

Figure 2B:
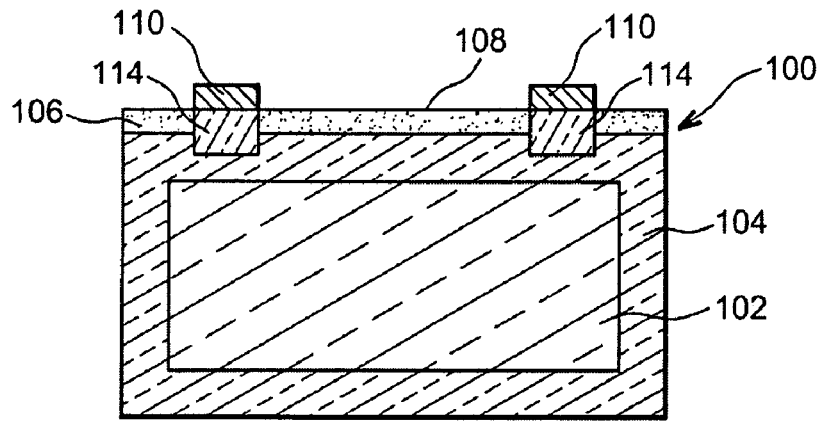

The solar cell 100 is then placed for example in an infrared passage furnace in order to undergo a first annealing operation. This first annealing operation is performed at a temperature between around 800° C. and 900° C., thus forming contacts 114 between the metallizations 110 and the N+ layer 104 (FIG. 2B). In this first annealing operation, hydrogen migrates in the form of ions from the hydrogen-rich antireflection layer 106 into the substrate 102, performing a passivation of the crystallographic defects and impurities of the substrate 102. This first annealing operation can also be performed in a conventional annealing furnace, or by other known annealing techniques. For example, this first annealing operation is performed at a temperature equal to around 850° C. for a period of between around 1 second and 10 seconds.

Figure 2C:
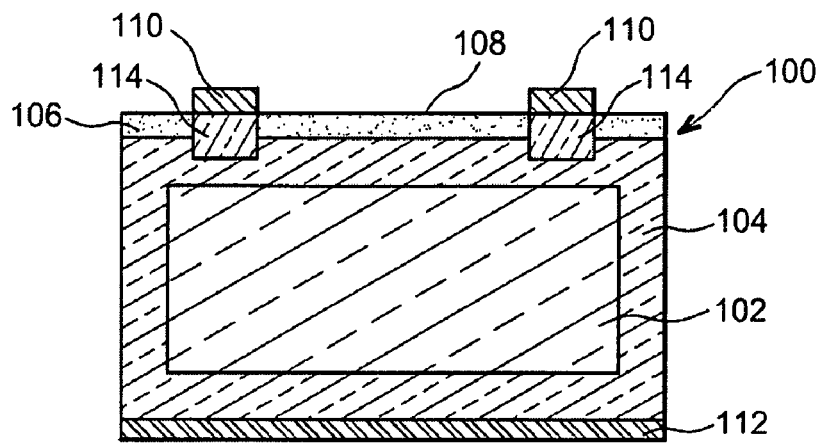
Figure 2D:
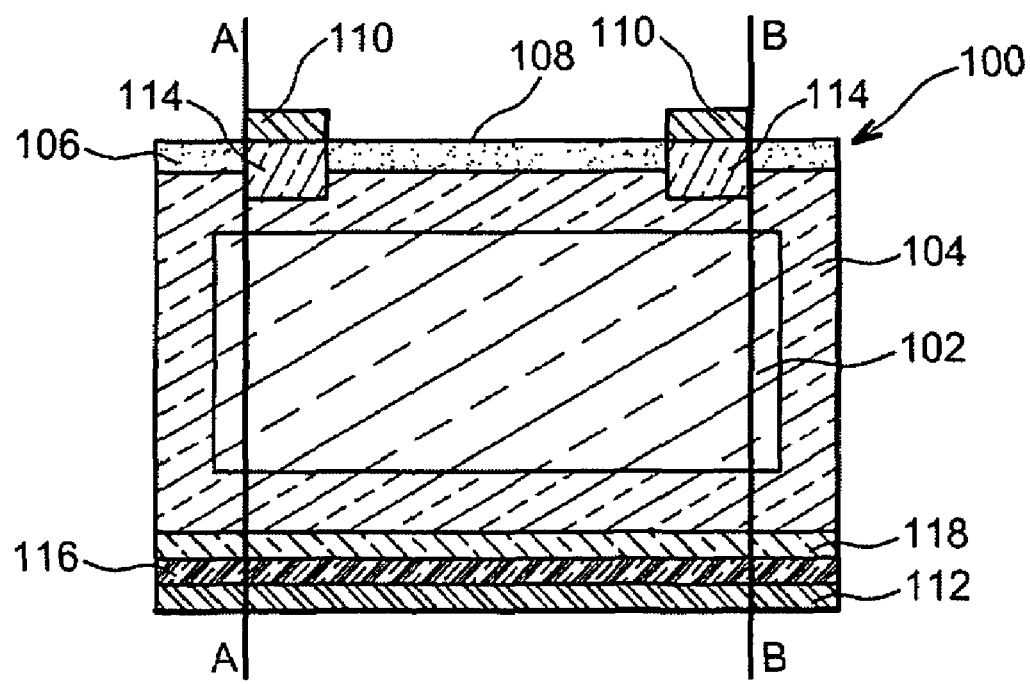

A metallization layer 112, for example based on aluminium, is then produced on the rear face of the substrate 102 (see FIG. 2C). This metallization layer 112 can, for example, be produced by serigraphy, or by photolithography or printing.

A second annealing operation is then performed on the photovoltaic cell 100, for example in an infrared passage furnace, at a temperature between around 700° C. and 800° C. (see FIG. 2D). This second annealing operation enables a better passivation of the defects and impurities of the substrate 102 because this temperature range is more favourable to the formation of bonds between the hydrogen and the impurities or the crystallographic defects than the temperature range of the first annealing operation (between around 800° C. and 900° C.), enabling the dissociation of molecules $H_2$ formed by the migration of hydrogen ions from the antireflection layer 106 into the substrate 102 and/or implanted in the substrate 102 by a step of hydrogenation of the substrate 102. This second annealing temperature between around 700° C. and 800° C. constitutes an ideal compromise between the intensity of the diffusion of hydrogen ions and their capacity to form bonds with the impurities and the defects in the substrate 102. This second annealing operation can also be performed in a conventional annealing furnace, or by other known annealing techniques.

This second annealing operation leads to the formation of a P+ doped layer 118 in the substrate 102 and the formation of a layer 116 based on an aluminium and silicon alloy, replacing the N+ layer 104 under the rear metallization 112. For P-type substrates, the P+ layer 118 performs the passivation of the rear face of the substrate 102 by a back-surface field effect (BSF) pushing minority carriers into the substrate 102. A metal other than aluminium can also be used to produce the metallization layer 112. This metal will be chosen so as to be capable also of obtaining a P+ doped layer 118. This second annealing operation can also be optimised by choosing an annealing temperature equal to around 770° C. for a period of between around 1 second and 10 seconds, in particular enabling good hydrogenation of the substrate 102.

Figure 2E:
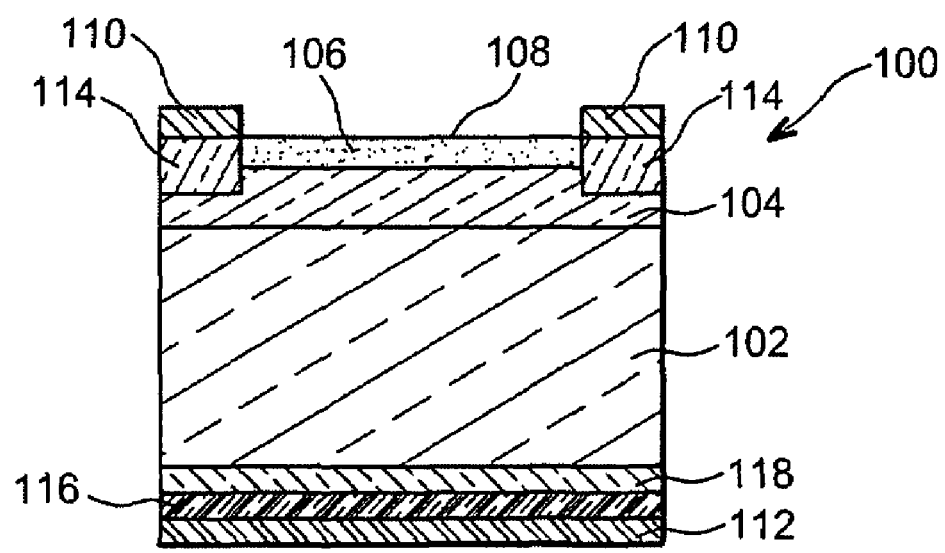

Finally, as shown in FIG. 2E, the portions of the N+ layer 104 coupling or connecting the layer 118 and the contacts 114, i.e. electrically coupling or connecting the metallizations 110 of the front face to the metallization layer 112 of the rear face. In FIG. 2E, all of the elements of the photovoltaic cell 100 located on the external side of planes AA and BB are removed, for example by laser, plasma, coating or any other etching means.

The method according to an embodiment of the invention is also particularly suitable for the production of photovoltaic cells comprising N-type substrates. In this case, the P+ doped layer 118 acts as an emitter of the PN junction of the photovoltaic cell. The N+ doped layer 104 then performs the passivation of the front face of the substrate 102 by a front-surface field effect (FSF) pushing minority carriers into the substrate 102, with the antireflection layer 106 also contributing to this passivation. It is also possible for the layer doped with the second type of conductivity 104 to be a P+ doped layer, obtained for example by diffusion of boron in the substrate 102.

According to an alternative, it is possible for the photovoltaic cell to undergo a third annealing operation at low temperature, for example between around 200° C. and 500° C. This third annealing operation, capable of being produced at ambient pressure, enables the hydrogen in the substrate 102 to form additional bonds with the crystallographic defects or impurities in the substrate 102.

The invention claimed is:

1. Method for metallization of at least one photovoltaic cell comprising a substrate based on a semiconductor with a first type of conductivity, a layer doped with a second type of conductivity produced in the substrate and forming a front face of the substrate, an antireflection layer produced on the front face of the substrate and forming a front face of the photovoltaic cell, which method comprising at least the steps of:
   a) producing at least one metallization on the front face of the photovoltaic cell, then
   b) a first annealing of the photovoltaic cell at a temperature between around 800° C. and 900° C. to diffuse hydrogen into the substrate, then
   c) producing at least one metallization on the rear face of the substrate, then
   d) a second annealing of the photovoltaic cell at a temperature between around 700° C. and 800° C. to form bonds between the hydrogen and impurities or crystallographic defects in the substrate.

2. Method according to claim 1, the antireflection layer being rich in hydrogen.

3. Method according to claim 1, also comprising at least one step of hydrogenation of the substrate.

4. Method according to claim 1, also comprising, after step d), a step of a third annealing of the photovoltaic cell at a temperature between around 200° C. and 500° C.

5. Method according to claim 1, the layer doped with the second type of conductivity being an N+ doped layer.

6. Method according to claim 1, the antireflection layer being based on silicon nitride.

7. Method according to claim 1, the substrate being a substrate based on multicrystalline silicon.

8. Method according to claim 1, the metallization produced on the front face of the photovoltaic cell being based on silver.

9. Method according to claim 1, the metallization produced on the rear face of the substrate being based on aluminium.

10. Method according to claim 1, the metallization on the front face and/or the metallization on the rear face being performed by serigraphy.

11. Method according to claim 1, the first and/or the second annealing operation being performed in an infrared passage furnace.

12. Method for producing at least one photovoltaic cell, comprising at least the steps of:
   texturising the surfaces of a substrate based on a semiconductor with a first type of conductivity,
   forming a layer doped with a second type of conductivity in the substrate forming a front face of the substrate,
   depositing an antireflection layer on the front face of the substrate, which layer forming a front face of the photovoltaic cell,
   implementing a method for metallization according to claim 1,
   removing at least a portion of the layer doped with the second type of conductivity electrically coupling the metallization of the front face to the metallization of the rear face of the photovoltaic cell.

13. Method according to claim 12, the texturisation step being performed with a potassium hydroxide-based solution.

14. Method according to claim 12, the layer doped with a second type of conductivity being an N+ layer formed by the diffusion of phosphorus in the substrate.

15. Method according to claim 12, the antireflection layer being a silicon nitride-based layer deposited by PECVD.

16. Method according to claim 12, also comprising a step of hydrogenation of the substrate implemented before and/or after the step of deposition of the antireflection layer.

* * * * *